(12) United States Patent
Lee

(10) Patent No.: US 9,262,001 B2
(45) Date of Patent: Feb. 16, 2016

(54) HIGH-ACCURACY OLED TOUCH DISPLAY PANEL STRUCTURE OF NARROW BORDER

(71) Applicant: SuperC-Touch Corporation, New Taipei (TW)

(72) Inventor: Hsiang-Yu Lee, New Taipei (TW)

(73) Assignee: SuperC-Touch Corporation, New Taipei (TW)

( * ) Notice: Subject to any disclaimer, the term of this patent is extended or adjusted under 35 U.S.C. 154(b) by 55 days.

(21) Appl. No.: 14/333,292

(22) Filed: Jul. 16, 2014

(65) Prior Publication Data

US 2015/0022470 A1 Jan. 22, 2015

(30) Foreign Application Priority Data

Jul. 17, 2013 (TW) .............. 102213483 A

(51) Int. Cl.
*G06F 3/041* (2006.01)
*H01L 27/32* (2006.01)

(52) U.S. Cl.
CPC ............ *G06F 3/0412* (2013.01); *H01L 27/323* (2013.01); *H01L 27/3244* (2013.01)

(58) Field of Classification Search
CPC ..................................... G06F 3/0412
USPC ......................................... 345/173
See application file for complete search history.

(56) References Cited

U.S. PATENT DOCUMENTS

| | | | | |
|---|---|---|---|---|
| 2009/0322702 A1* | 12/2009 | Chien | ............ | G06F 3/044 345/174 |
| 2010/0156827 A1* | 6/2010 | Joo | ............ | G02F 1/13338 345/173 |
| 2012/0105337 A1* | 5/2012 | Jun | ............ | G06F 3/0412 345/173 |
| 2012/0162584 A1* | 6/2012 | Chang | ............ | G06F 3/0412 349/106 |
| 2013/0242211 A1* | 9/2013 | Lee | ............ | G06F 3/0412 349/12 |
| 2013/0314371 A1* | 11/2013 | Lee | ............ | G06F 3/0412 345/174 |
| 2014/0078104 A1* | 3/2014 | Lee | ............ | G06F 3/044 345/174 |
| 2014/0375911 A1* | 12/2014 | Lee | ............ | G06F 3/0412 349/12 |
| 2015/0009426 A1* | 1/2015 | Lee | ............ | G02F 1/13338 349/12 |
| 2015/0042612 A1* | 2/2015 | Lee | ............ | G02F 1/13338 345/174 |
| 2015/0048346 A1* | 2/2015 | Lee | ............ | H01L 27/323 257/40 |

* cited by examiner

*Primary Examiner* — Jason Olson
(74) *Attorney, Agent, or Firm* — Muncy, Geissler, Olds & Lowe, P.C.

(57) ABSTRACT

A high-accuracy OLED touch display panel structure of narrow border includes an upper substrate, a lower substrate, an OLED layer configured between the upper and lower substrates, a sensing electrode layer, a thin film transistor layer, a cathode layer, and an anode layer. The sensing electrode layer has a plurality of first conductor line units. The thin film transistor layer includes a plurality of gate lines, a plurality of source lines, and a plurality of second conductor line units. The plurality of first conductor line units and the plurality of second conductor line units form a sensing touch pattern structure for sensing an approaching external object. The plurality of first conductor line units and the plurality of second conductor line units are disposed corresponding to positions of the plurality of gate lines and the plurality of source lines.

15 Claims, 13 Drawing Sheets

HIGH-ACCURACY OLED TOUCH DISPLAY PANEL STRUCTURE OF NARROW BORDER

BACKGROUND OF THE INVENTION

1. Field of the Invention

The present invention relates to a structure of touch display panel and, more particularly, to a high-accuracy OLED touch display panel structure of narrow border.

2. Description of Related Art

In recent year, the flat panel display industry has been rapidly developed, and many products have also been made in pursuit of light weight, thinness, small volume and fine image quality for developing several types of flat-panel displays to replace traditional cathode ray tube display (CRT). FIG. 1 schematically illustrates the types of known display panels. As shown in FIG. 1, the flat panel display includes liquid crystal display (LCD), plasma display panel (PDP), organic light emitting diode (OLED) display, field emission display (FED), and vacuum fluorescence display (VFD).

Among these types of flat panel displays, the organic light emitting diode display (OLED) technology is the one with great potential. OLED was first published by Eastman Kodak Co. in 1987. It has the features of thinness, light weight, self-illumination, low driving voltage, high efficiency, high contrast, high color saturation, fast response, flexibility, etc., and is therefore deemed as positively evaluated display technology following the TFT-LCD. In recent years, due to the development of mobile communications, digital products and digital televisions, the demand for high-quality full-color flat-panel displays is rapidly increased. The OLED display is provided with not only the advantages of LCD display including thinness, power-saving, and full-color display, but also the features of wide viewing angle, self-illumination, and fast response that are better than LCD.

FIG. 2 schematically illustrates the basic structure of prior OLED display. The OLED display 200 includes a cathode layer 210, an OLED layer 220, an anode layer 230, a thin film transistor layer 240, a lower substrate 250, and an upper substrate 260, wherein the OLED layer 220 further includes a hole transporting layer (HTL) 221, an emitting layer 223, and an electron transporting layer (ETL) 225.

The light-emitting principle of OLED is such that the electrons and electric holes are injected from the cathode layer 210 and the anode layer 230 respectively by applying electric field and, after the electric holes pass through the electric hole transport sub-layer 221 and electrons pass through the electron transport sub-layer 225, the electrons and electric holes enter the light-emitting layer 223 with fluorescent characteristics and then are combined to produce excited photons, which immediately release energy and return to the ground state. The released energy will generate different colors of light based on different luminescent materials, so as to cause OLED to emit light.

Modern consumer electronic apparatuses are typically equipped with touch panels for use as their input devices. According to different sensing manners, the touch panels can be classified into resistive type, capacitive type, acoustic type, optical type and other type.

The principle of touch panels is based on different sensing manners to detect a voltage, current, acoustic wave, or infrared to thereby detect the coordinates of touch points on a screen where a finger or other medium touches. For example, a resistive touch panel uses a potential difference between the upper and lower electrodes to compute the position of a pressed point for detecting the location of the touch point, and a capacitive touch panel uses a capacitance change generated in an electrostatic combination of the arranged transparent electrodes with a human body to generate a current or voltage for detecting touch coordinates.

With the widespread use of smart phones, the multi-touch technique is getting more and more important. Currently, the multi-touch is implemented by projected capacitive touch technique.

The projected capacitive touch technique makes use of two layers of indium tin oxide (ITO) to form a matrix of sensing units arranged in intersected columns and rows, so as to detect precise touch positions. The projected capacitive touch technique is based on capacitive sensing, wherein it designs plural etched ITO electrodes and adds plural sets of transparent conductor lines that are on different planes and vertical with each other to form X-axis and Y-axis driving lines. These conductor lines are all controlled by a controller for being sequentially scanned to detect capacitance changes that are sent to the controller.

FIG. 3 is a schematic diagram of a prior touch panel structure 300. On the prior touch panel structure 300, the sensing conductor lines 310, 320 are arranged in the second direction (Y-direction) and in the first direction (X-direction). When a touch sensing is being performed and the sensing conductor lines 320 have to transmit the sensed signals to the control circuit 331 on a flexible circuit board 330, a great amount of wires at the side of the panel 340 is required for connection to the flexible circuit board 330. Such a prior design increases the border width of the touch panel and thus is not suitable for the trend of narrow border.

Therefore, it is desirable to provide an improved touch panel device to mitigate and/or obviate the afore-mentioned problems.

SUMMARY OF THE INVENTION

The object of the present invention is to provide a high-accuracy OLED touch display panel structure of narrow border capable of significantly increasing the light penetration rate of touch panel, greatly saving the material cost and reducing the manufacturing cost, which is more suitable for the design of touch panel with narrow border in comparison with the prior art.

To achieve the object, there is provided a high-accuracy OLED touch display panel structure of narrow border, which comprises: an upper substrate; a lower substrate parallel to the upper substrate; an OLED layer configured between the upper substrate and the lower substrate; a sensing electrode layer disposed at one side of the lower substrate facing the OLED layer, the sensing electrode layer having M first conductor line units and N connection lines arranged in a first direction for sensing an approaching external object, where M and N are each a positive integer; a thin film transistor layer disposed at one side of the sensing electrode layer facing the OLED layer, the thin film transistor layer including a plurality of gate lines, a plurality of source lines, and N second conductor line units arranged in a second direction for driving a corresponding pixel driving circuit according to a display pixel signal and a display driving signal; a cathode layer disposed at one side of the upper substrate facing the OLED layer; and an anode layer disposed at one side of the thin film transistor layer facing the OLED layer, the anode layer including a plurality of anode pixel electrodes, each anode pixel electrode being connected to a source or drain of a corresponding pixel driving transistor, wherein each second conductor line unit makes use of a corresponding i-th connection line to be extended to one edge of the panel structure of narrow border, where i is a positive integer and $1 \leq i \leq N$, the N second conductor line units, the M first conductor line units, and the N connection lines are disposed corresponding to positions of the plurality of gate lines and source lines.

DETAILED DESCRIPTION OF THE PREFERRED EMBODIMENT

Figure 4:
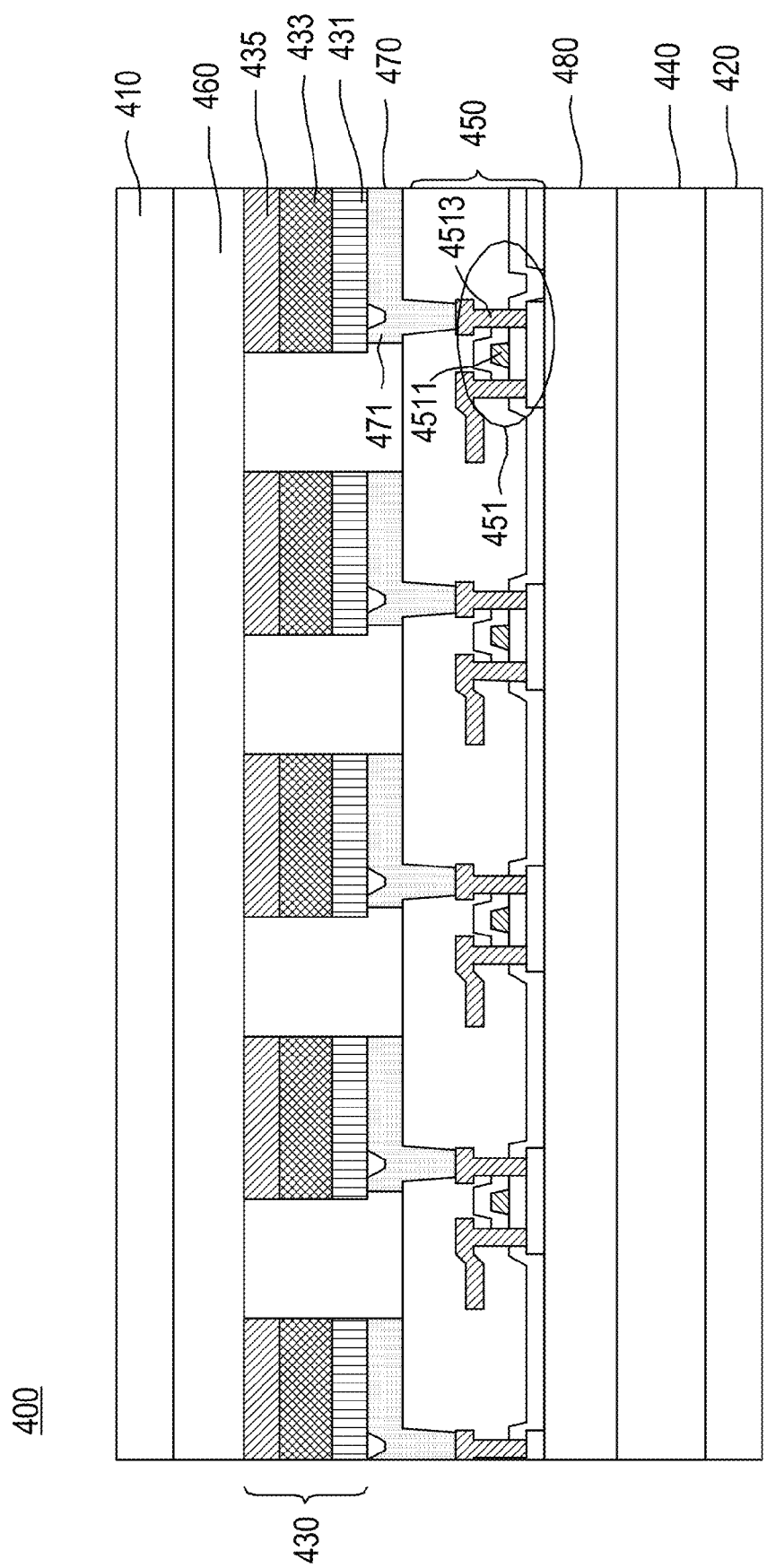
FIG. 4 is a cross sectional view of the high-accuracy OLED touch display panel structure of narrow border in accordance with the present invention.

The present invention relates to a high-accuracy OLED touch display panel structure of narrow border. FIG. 4 is a stackup diagram of the high-accuracy OLED touch display panel structure of narrow border 400 in accordance with the present invention. As shown, the high-accuracy OLED touch display panel structure of narrow border 400 includes an upper substrate 410, a lower substrate 420, an OLED layer 430, a sensing electrode layer 440, a thin film transistor layer 450, a cathode layer 460, an anode layer 470, and an insulation layer 480.

The upper substrate 410 and the lower substrate 420 are parallel to each other. The OLED layer 430 is disposed between the upper and lower substrates 410, 420.

In the present invention, the sensing electrode layer 440 is disposed at one side of the lower substrate 420 that faces the OLED layer 430. On the sensing electrode layer 440, there are M first conductor line units 40-1, 40-2, ..., 40-M and N connection lines 41-1, 41-2, ..., 41-N arranged in a first direction (X-direction) and, on the thin film transistor layer 450, there are N second conductor line units 50-1, 50-2, ..., 50-N arranged in a second direction (Y-direction), where M and N are each a positive integer, so as to form a sensing touch pattern structure as shown in FIG. 5.

Figure 5:
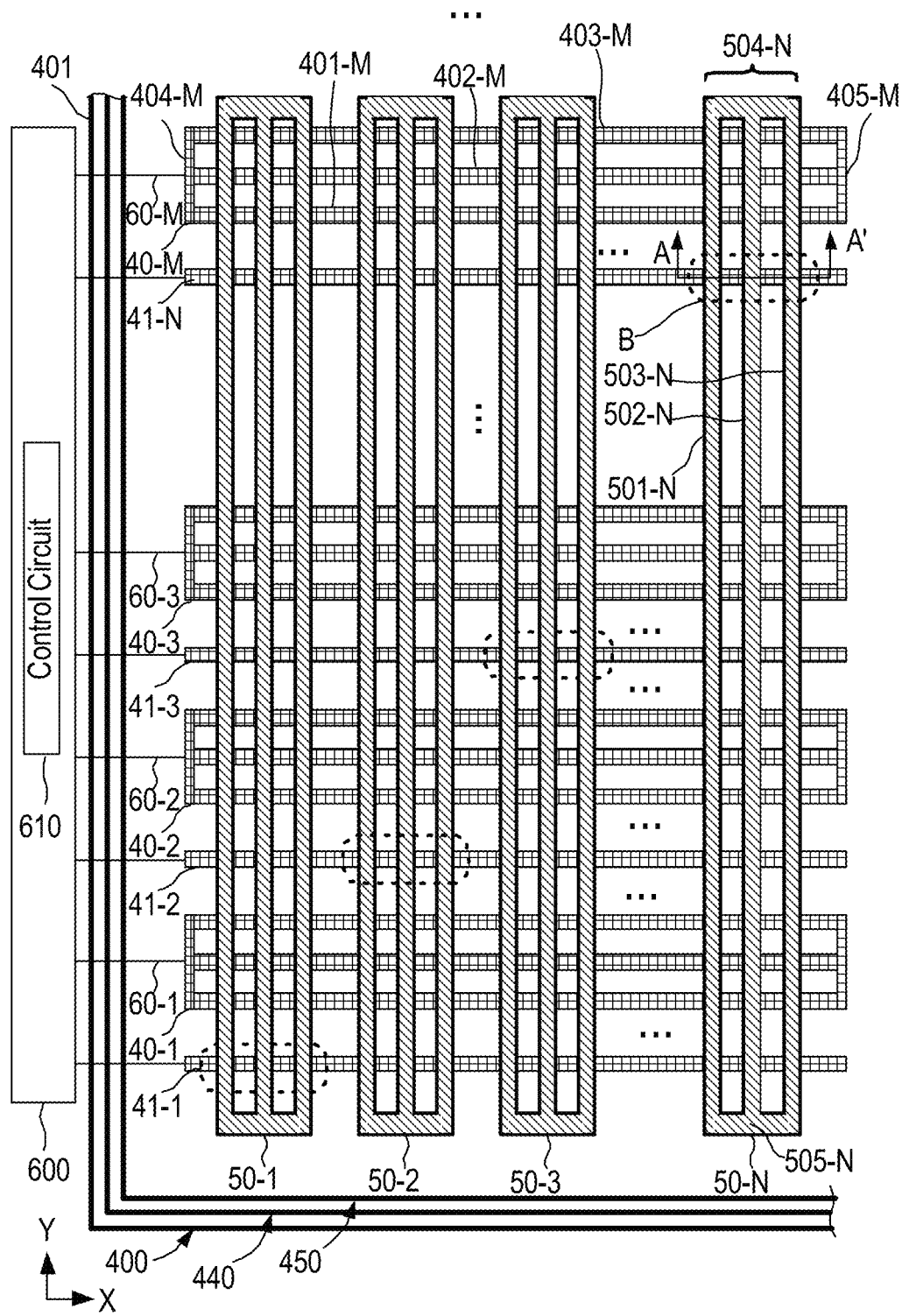
FIG. 5 schematically illustrates the sensing touch pattern structure of the sensing electrode layer and the thin film transistor layer in accordance with the present invention.

FIG. 5 schematically illustrates the thin film transistor layer 450 and the sensing electrode layer 440 in accordance with the present invention. As shown in FIG. 5, the sensing electrode layer 440 is disposed at one side of the lower substrate 420 that faces the OLED layer 430. The sensing electrode layer 440 includes M first conductor line units 40-1, 40-2, ..., 40-M and N connection lines 41-1, 41-2, ..., 41-N arranged in a first direction (X-direction), where M and N are each a positive integer.

The thin film transistor layer 450 is disposed at one side of the sensing electrode layer 440 that faces the OLED layer 430. The thin film transistor layer 450 includes a plurality of gate lines (not shown), a plurality of source lines (not shown), and N second conductor line units 50-1, 50-2, ..., 50-N arranged in a second direction (Y-direction). With reference with FIG. 4, the thin film transistor layer 450 further includes pixel driving circuits. Each pixel driving circuit drives a corresponding pixel driving transistor according to a display pixel signal and a display driving signal. The M first conductor line units 40-1, 40-2, ..., 40-M and the N second conductor line units 50-1, 50-2, ..., 50-N are configured for sensing an approaching external object according to a touch driving signal.

Each of the N second conductor line units 50-1, 50-2, ..., 50-N makes use of a corresponding i-th connection line of the N connection lines 41-1, 41-2, ..., 41-N to be extended to one edge 401 of the panel structure of narrow border 400, where i is a positive integer and 1≤i≤N. Each of the M first conductor line units 40-1, 40-2, ..., 40-M is extended to the same edge 401 of the panel structure of narrow border 400 through a corresponding metal wire for being further connected to a flexible circuit board 600.

The N second conductor line units 50-1, 50-2, ..., 50-N, the M first conductor line units 40-1, 40-2, ..., 40-M, and the N connection lines 41-1, 41-2, ..., 41-N are disposed at positions corresponding to the positions of the plurality of gate lines and the plurality of source lines.

As shown in FIG. 5, each of the M first conductor line units 40-1, 40-2, ..., 40-M is composed of plural metal sensing lines, and each of the N second conductor line units 50-1, 50-2, ..., 50-N is composed of plural metal sensing lines. For example, the first conductor line unit 40-M is composed of three metal sensing lines 401-M, 402-M and 403-M arranged in the first direction (X-direction). The three metal sensing lines 401-M, 402-M and 403-M are connected by metal sensing lines 404-M and 405-M at two ends, respectively. The second conductor line unit 50-N is composed of three metal sensing lines 501-N, 502-N and 503-N arranged in the second direction (Y-direction). The three metal sensing lines 501-N, 502-N and 503-N are connected by metal sensing lines 504-N and 505-N at two ends, respectively. In FIG. 5, the three metal sensing lines 501-N, 502-N and 503-N of the second conductor line unit 50-N are composed of plural line segments in implementation and will be explained in more detail in FIG. 11.

The M first conductor line units 40-1, 40-2, ..., 40-M and the N second conductor line units 50-1, 50-2, ..., 50-N are not electric connected with each other. Preferably, an insulation layer 480 may be arranged between the sensing electrode layer 440 and the thin film transistor layer 450. Alternatively, it is also applicable to arrange insulation traces or insulation blocks in-between the intersections of the M first conductor line units 40-1, 40-2, ..., 40-M and the N second conductor line units 50-1, 50-2, ..., 50-N.

The plural metal sensing lines of each of the M first conductor line units 40-1, 40-2, ..., 40-M form a quadrilateral region, and the plural metal sensing lines of each of the N second conductor line units 50-1, 50-2, ..., 50-N also form a quadrilateral region. The metal sensing lines in each quadrilateral region are electrically connected together, while any two of the quadrilateral regions are not connected with each other. The quadrilateral region has a shape of rectangle or square. The first direction is perpendicular to the second direction. Each of the N connection lines 41-1, 41-2, . . . , 41-N is disposed between two first conductor line units (40-1, 40-2, . . . , 40-M).

The metal sensing lines in each quadrilateral region formed by the plural metal sensing lines of each of the M first conductor line units 40-1, 40-2, . . . , 40-M and the N second conductor line units 50-1, 50-2, . . . , 50-N are made of conductive metal material or alloy material. The conductive metal material is selectively to be chromium, barium, aluminum, silver, copper, titanium, nickel, tantalum, cobalt, tungsten, magnesium, calcium, potassium, lithium, indium, or a mixture of LiF, MgF2 or Li2O.

As shown in FIG. 5, each of the N second conductor line units 50-1, 50-2, . . . , 50-N is electrically connected with a corresponding connection line (41-1, 41-2, . . . , 41-N) at a position denoted by a dotted ellipse, and each of the N connection lines 41-1, 41-2, . . . , 41-N is extended to the same edge 401 of the high-accuracy OLED touch display panel structure of narrow border 400 through a corresponding metal wire for being further connected to the flexible circuit board 600. Each of the M first conductor line units 40-1, 40-2, . . . , 40-M is extended to the same edge 401 of the high-accuracy OLED touch display panel structure of narrow border 400 through a corresponding metal wire for being further connected to the flexible circuit board 600.

The surface of the high-accuracy OLED touch display panel structure of narrow border 400 is provided to receive at least one touch point. There is further provided with a control circuit 610 which is electrically connected to the M first conductor line units 40-1, 40-2, . . . , 40-M and the N second conductor line units 50-1, 50-2, . . . , 50-N via the flexible circuit board 600. The M first conductor line units 40-1, 40-2, . . . , 40-M and the N second conductor line units 50-1, 50-2, . . . , 50-N correspondingly generate a sensing signal in response to the position and magnitude of a finger's touch on at least one touch point of the high-accuracy OLED touch display panel structure of narrow border 400. The control circuit 610 is electrically connected to the M first conductor line units 40-1, 40-2, . . . , 40-M and the N second conductor line units 50-1, 50-2, . . . , 50-N via the flexible circuit board 600, so as to calculate the coordinate of the at least one touch point based on the sensing signal.

Figure 6:
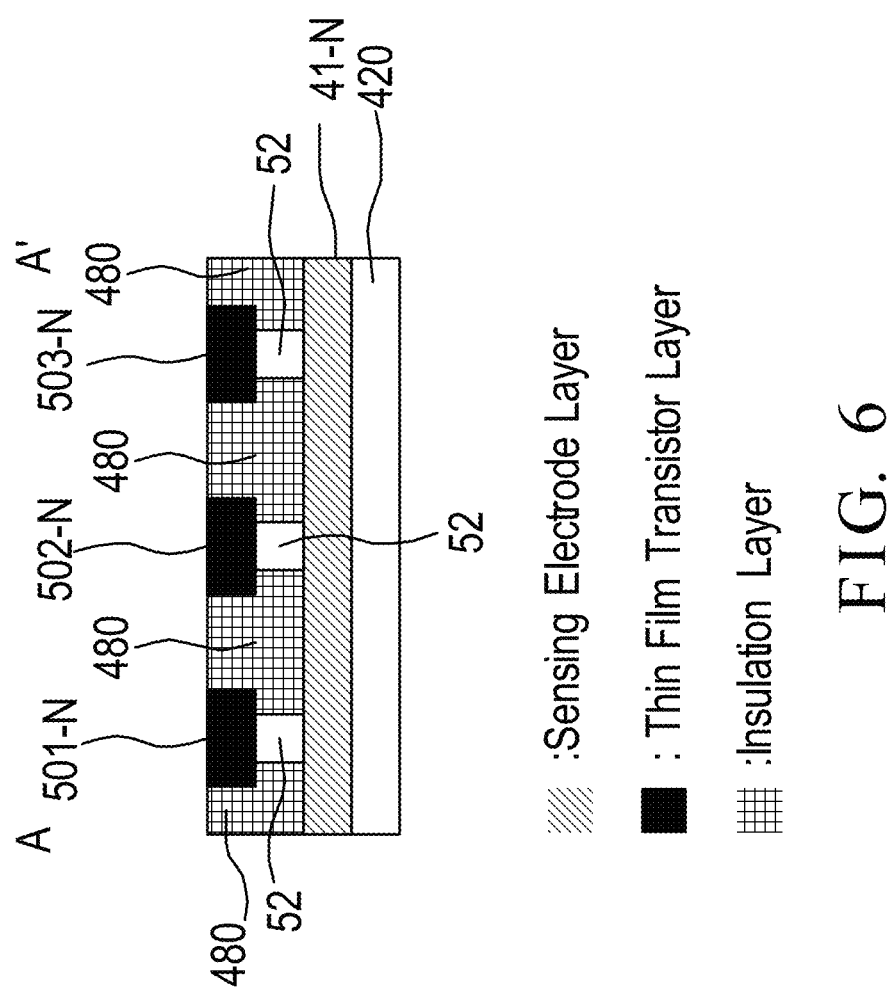
FIG. 6 is a cross sectional view taking along A-A' line of FIG. 5.

FIG. 6 is a cross sectional view taking along A-A' line of FIG. 5. As shown in FIG. 6, the second conductor line unit 50-N is connected with the connection line 41-N at the position denoted by the dotted ellipse B of FIG. 5. With reference to FIGS. 4 and 6, the insulation layer 480 is arranged between the sensing electrode layer 440 and the thin film transistor layer 450, and the second conductor line unit 50-N is electrically connected to the connection line 41-N through a via 52 that passes through the insulation layer 480. That is, with the connection line 41-N, the second conductor line unit 50-N is able to transmit the sensed signal to the control circuit 610.

Figure 7:
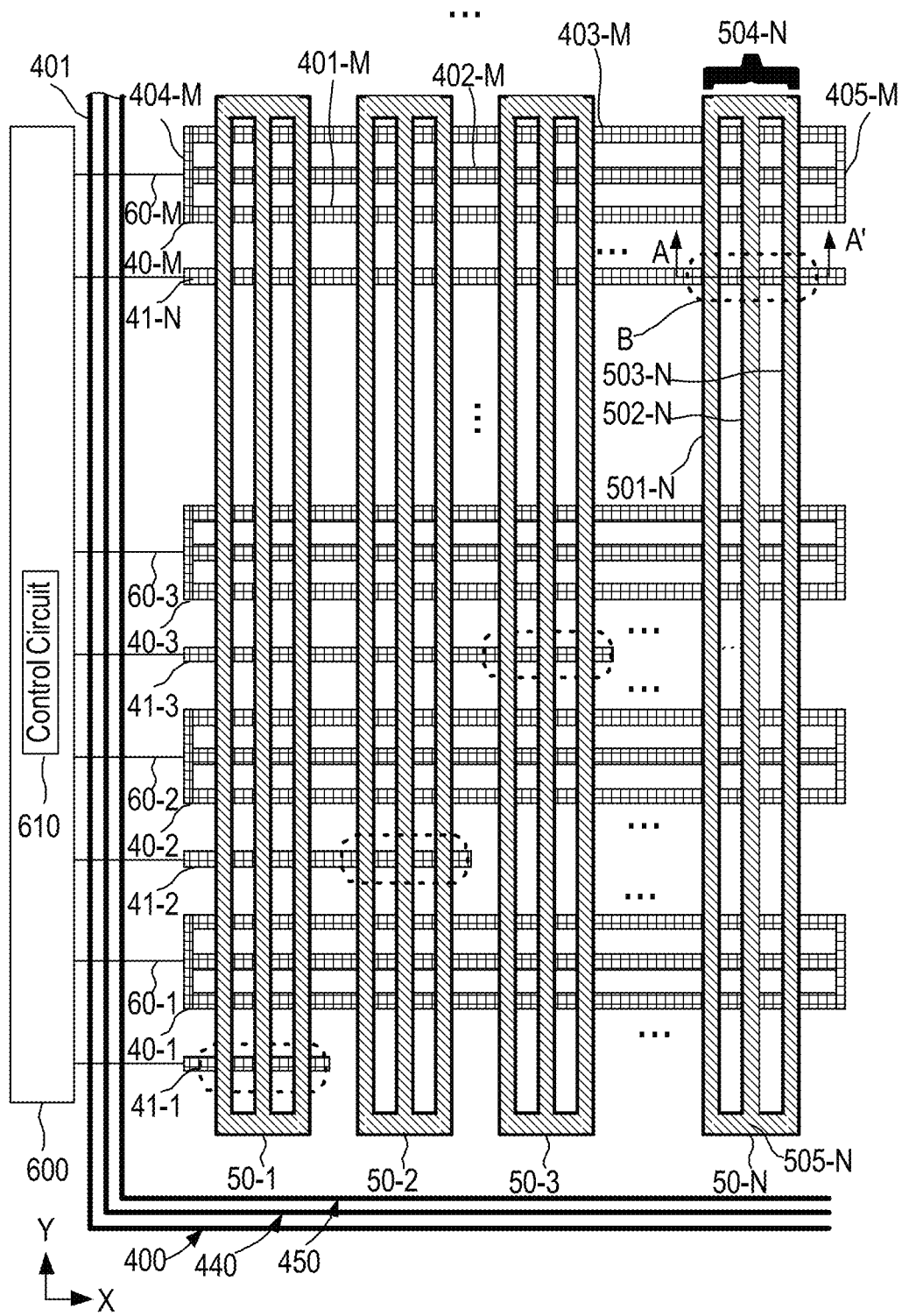
FIG. 7 is schematic diagram of a high-accuracy OLED touch display panel structure of narrow border according to another embodiment of the invention.

FIG. 7 is a schematic diagram of a high-accuracy OLED touch display panel structure of narrow border 400 according to another embodiment of the invention, which is similar to FIG. 5 except that the N connection lines 41-1, 41-2, . . . , 41-N have different lengths. As shown, the lengths of the N connection lines 41-1, 41-2, . . . , 41-N are gradually decreased in this embodiment.

Figure 8:
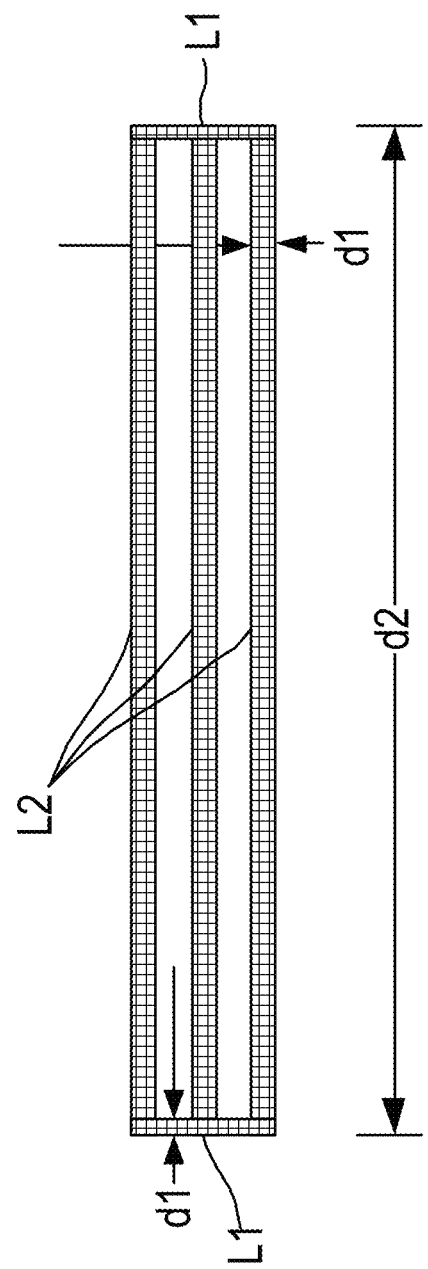
FIG. 8 is a schematic diagram of a first conductor line unit in accordance with the present invention.

FIG. 8 is a schematic diagram of a first conductor line unit (40-1, 40-2, . . . , 40-M). As shown, the quadrilateral region is a rectangle composed of three metal sensing lines L2 in the first direction and two metal sensing lines L1 in a second direction. In other embodiments, the number of metal sensing lines can be varied according to the actual requirement.

Figure 9:
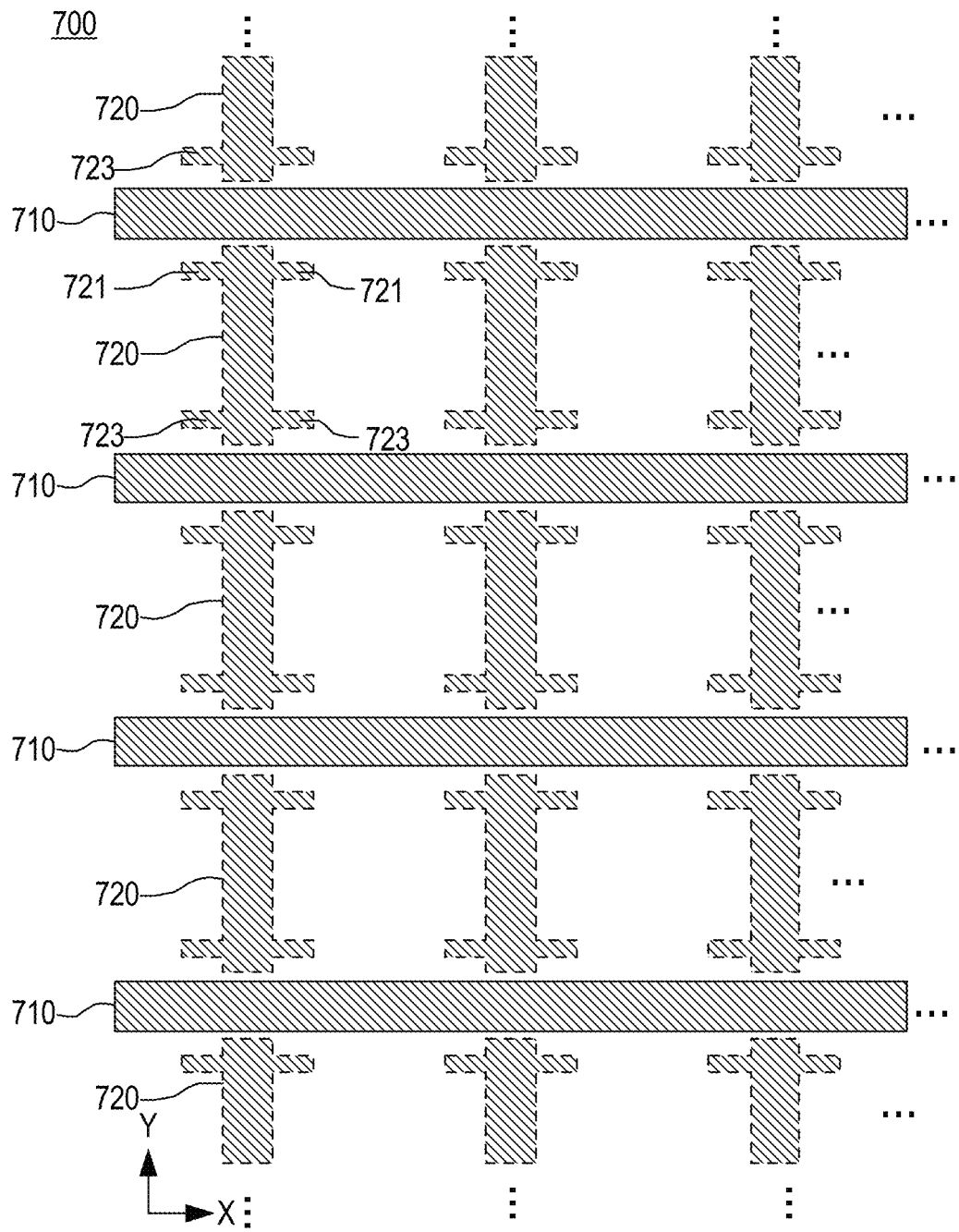
FIG. 9 schematically illustrates the gate line sub-layer in accordance with the present invention.

In the present invention, the N second conductor line units 50-1, 50-2, . . . , 50-N are disposed in the thin film transistor layer 450. The thin film transistor layer 450 includes a gate line sub-layer and a source line sub-layer. FIG. 9 schematically illustrates the gate line sub-layer 700 in accordance with the present invention. The gate line sub-layer 700 has a plurality of gate lines 710 and a plurality of wiring segments 720. The plurality of gate lines 710 are arranged in the first direction (X-direction) and the plurality of wiring segments 720 are arranged in the second direction (Y-direction), wherein the plurality of wiring segments 720 arranged in the second direction are separated by the plurality of gate lines 710. More specifically, as shown in FIG. 9, the plurality of wiring segments 720 are deemed as a plurality of wiring segment lines arranged in the second direction, each wiring segment line having several wiring segments 720 aligned in the second direction while two aligned adjacent wiring segments 720 are separated by a corresponding gate line 710. Each of the plurality of wiring segments 720 arranged in the second direction includes two ends respectively having a first extension part 721 and a second extension part 723 arranged in the first direction and extended toward two sides of the wiring segment 720, in which the first direction is substantially vertical with the second direction. It is noted that FIG. 9 only shows the possible positions where the plurality of wiring segments 720 arranged in the second direction can be disposed. In actual arrangement of wirings, it is possible that only part of the positions, but not all positions, is disposed with the wiring segments 720, and thus the plurality of wiring segments 720 in FIG. 9 are shown by dotted lines.

Figure 10:
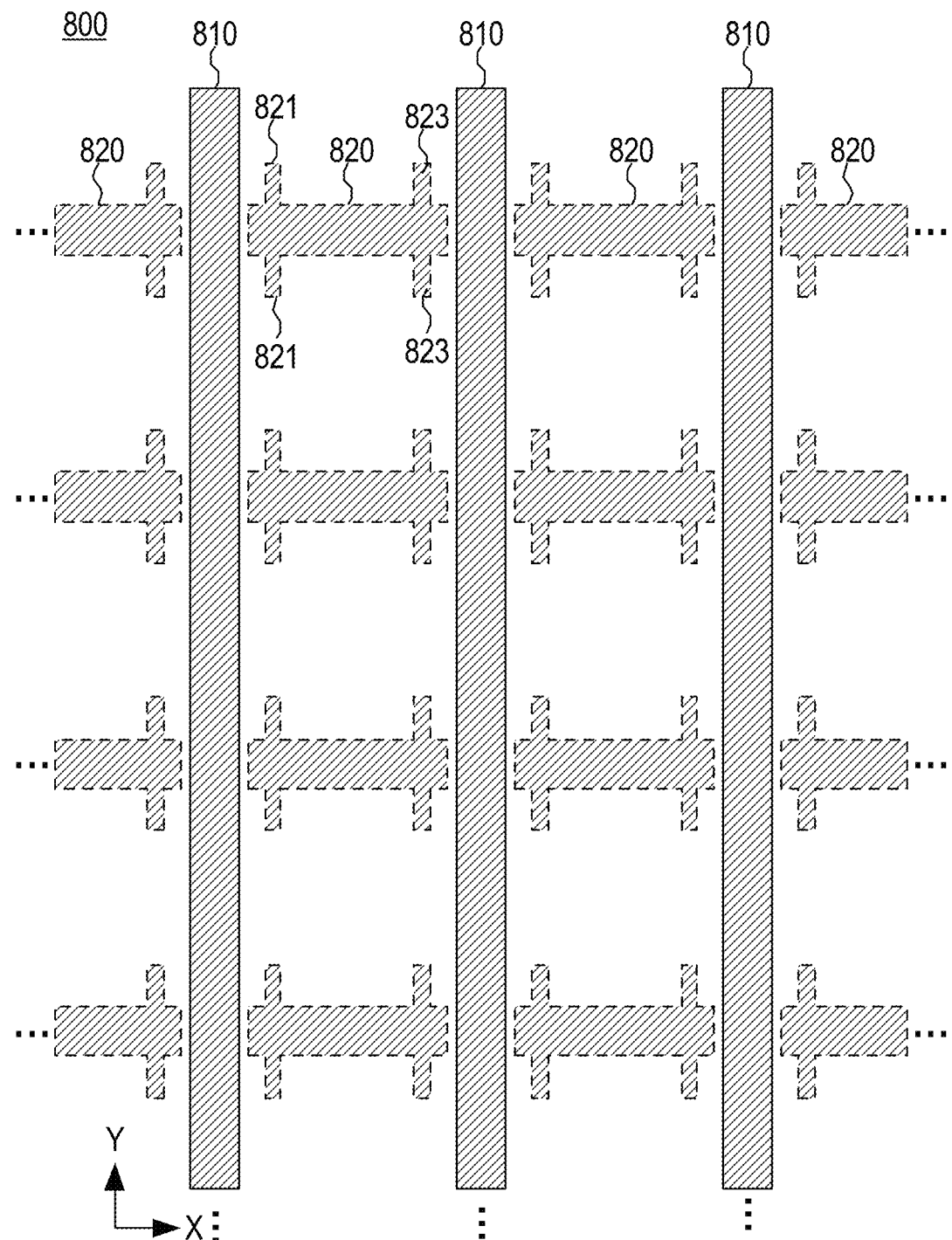
FIG. 10 schematically illustrates the source line sub-layer in accordance with the present invention.

FIG. 10 schematically illustrates the source line sub-layer 800 in accordance with the present invention. The source line sub-layer 800 is disposed at one side of the gate line sub-layer 700 facing the OLED layer 430 and has a plurality of source lines 810 and a plurality of wiring segments 820. The plurality of source lines 810 are arranged in the second direction (Y-direction) and the plurality of wiring segments 820 are arranged in the first direction (X-direction), wherein the plurality of wiring segments 820 arranged in the first direction are separated by the plurality of source lines 810. More specifically, as shown in FIG. 10, the plurality of wiring segments 820 are deemed as a plurality of wiring segment lines arranged in the first direction, each wiring segment line having several wiring segments 820 aligned in the first direction while two aligned adjacent wiring segments 820 are separated by a corresponding source line 810. Each of the plurality of wiring segments 820 arranged in the first direction includes two ends respectively having a first extension part 821 and a second extension part 823 arranged in the second direction (Y-direction) and extended toward two sides of the wiring segment 820.

As shown in FIG. 9 and FIG. 10, the line width of the wiring segment 820 arranged in the first direction is equal to the line width of the gate line 710, and the line width of the wiring segment 720 arranged in the second direction is equal to the line width of the source line 810. In other embodiments, the line width of the wiring segment 820 arranged in the first direction can be smaller than the line width of the gate line 710, and the line width of the plurality of wiring segment 720 arranged in the second direction can be smaller than the line width of the source line 810.

In the present invention, the plurality of wiring segments 720 arranged in the second direction are disposed at positions same as the positions of the source lines 810 but on different layers. Similarly, the plurality of wiring segments 820 arranged in the first direction are disposed at positions same as the positions of the gate lines 710 but on different layers. In the present invention, the plurality of wiring segments 820 arranged in the first direction and the plurality of wiring segments 720 arranged in the second direction are disposed at positions corresponding to the positions of the plurality of gate lines 710 and the plurality of source lines 810.

Figure 11:
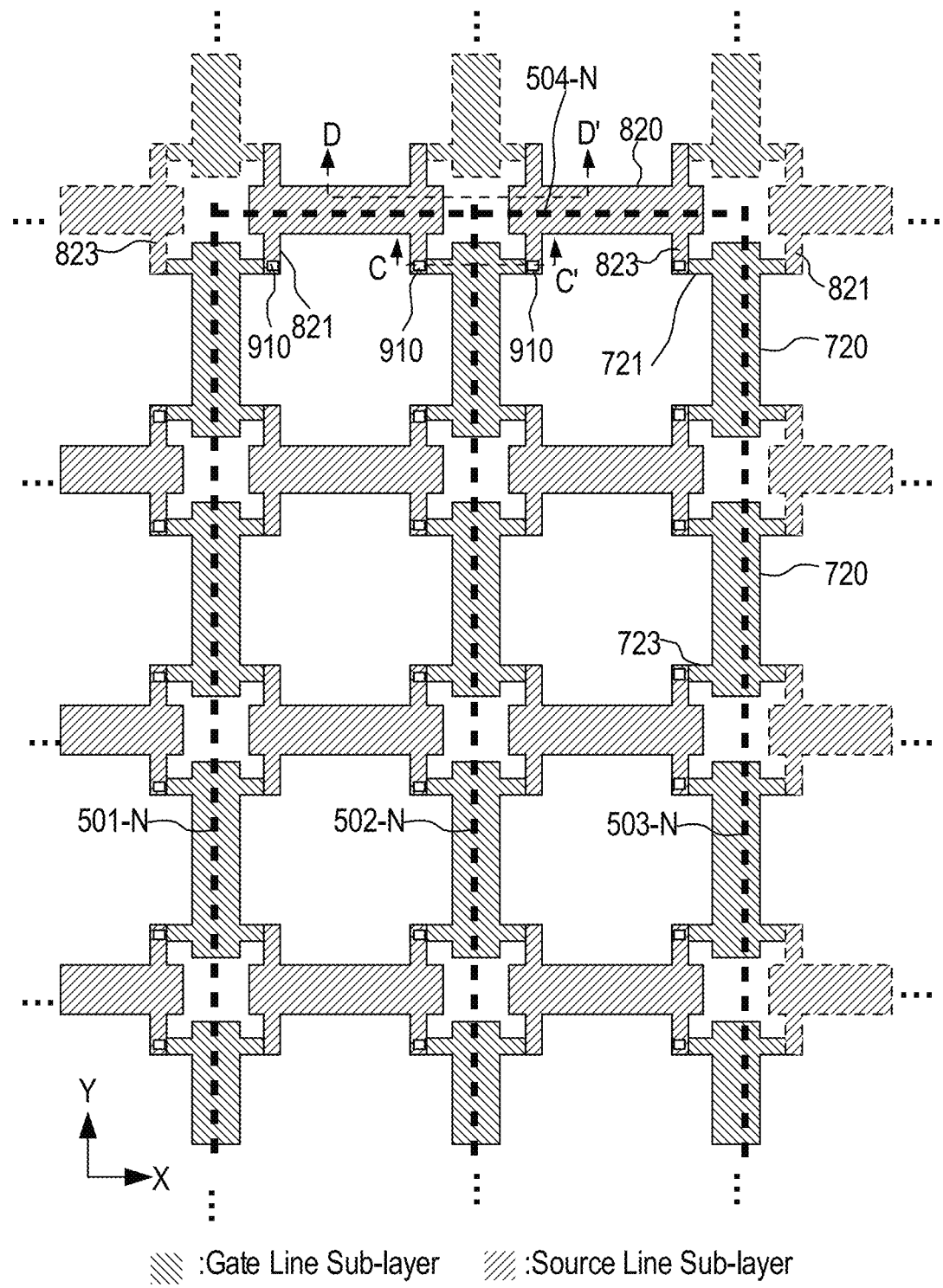
FIG. 11 schematically illustrates the electrical connection between the plurality of wiring segments arranged in the first direction and the plurality of the wiring segments arranged in the second direction in accordance with the present invention.

FIG. 11 schematically illustrates the electrical connection between the plurality of wiring segments 820 arranged in the first direction and the plurality of the wiring segments 720 arranged in the second direction in accordance with the present invention, wherein the extension parts 721, 723, 821, 823 are partially overlapped and electrically connected thereby, so as to allow the plurality of wiring segments 820 arranged in the first direction and the plurality of wiring segments 720 arranged in the second direction to form the N second conductor line units 50-1, 50-2, . . . , 50-N of the thin film transistor layer 450. As shown in FIG. 11, there is formed with three metal sensing lines 501-N, 502-N and 503-N arranged in the second direction and a metal sensing lines 504-N arranged in the first direction.

From the aforementioned description, it is known that the plurality of the wiring segments 720 arranged in the second direction and the plurality of wiring segments 820 arranged in the first direction can respectively form a second conductor line unit (50-1, 50-2, . . . , 50-N). That is, the extension parts 721, 723, 821, 823 are partially overlapped and electrically connected thereby, and a set of metal sensing lines (501-N, 502-N, 503-N, 504-N, 505-N) can be formed by the plurality of wiring segments 720 arranged in the second direction and the plurality of wiring segments 820 arranged in the first direction, in which the N second conductor line units 50-1, 50-2, . . . , 50-N can be formed by the set of metal sensing lines (501-N, 502-N, 503-N, 504-N, 505-N). As shown in FIG. 6, the N second conductor line units 50-1, 50-2, . . . , 50-N are electrically connected to the connection lines 41-1, 41-2, . . . , 41-N through the vias 52 that pass through the insulation layer 480 so as to form the sensing conductive lines in the second direction.

Figure 12A:
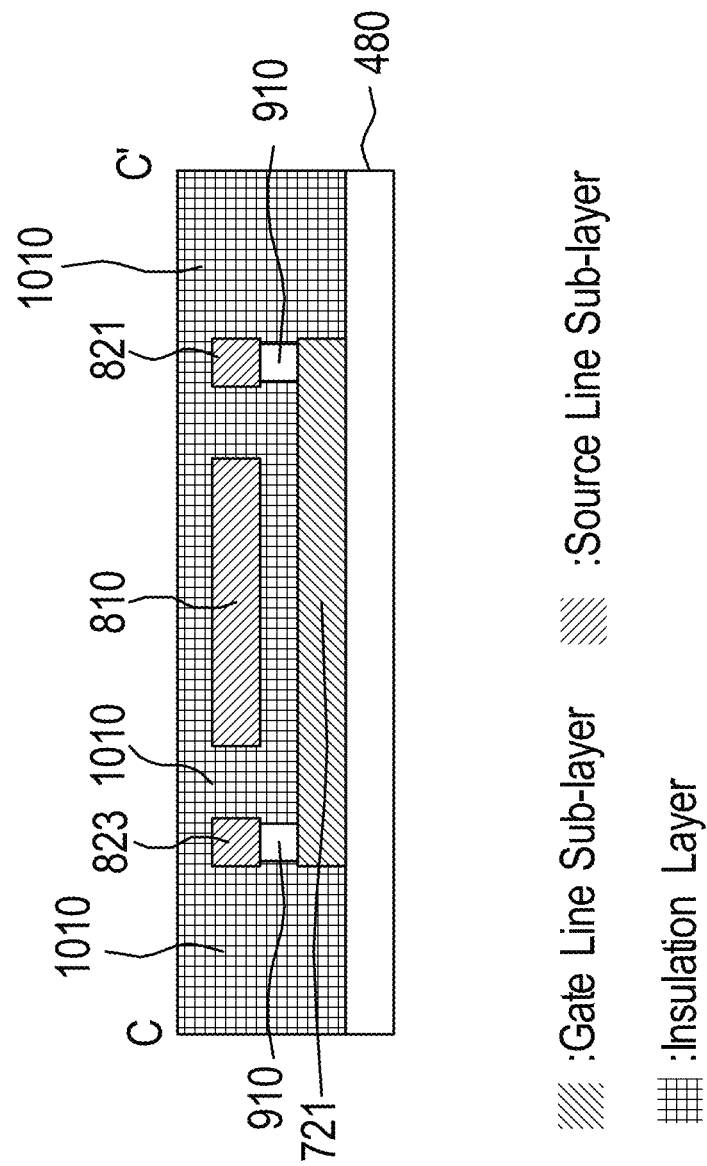
FIG. 12A and FIG. 12B are two cross sectional views taking along C-C' and D-D' lines of FIG. 11, respectively.
Figure 12B:
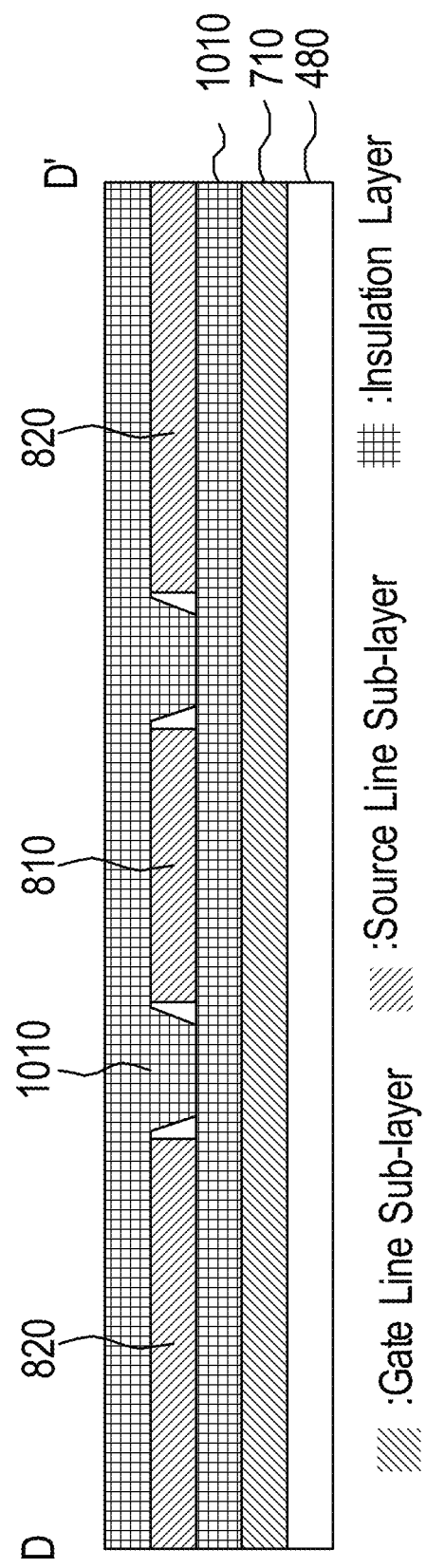

FIG. 12A and FIG. 12B are two cross sectional views taking along C-C' and D-D' lines of FIG. 11, respectively. As shown in FIG. 12A, there is an insulation layer 1010 arranged between the first extension part 721 and the source lines 810. The first extension part 721 arranged in the first direction is electrically connected to the first extension part 821 arranged in the second direction and the second extension part 823 arranged in the second direction through vias 910. As shown in FIG. 12B, there is an insulation layer 1010 arranged between the gate line 710 and the source line 810. Because of the insulation layer 1010 arranged between the source line 810 and the first extension part 821 and the second extension part 823 arranged in the second direction, the source line 810 is not electrically connected to the first extension part 821 and second extension part 823.

The OLED layer 430 includes an electrical hole transporting layer 431, an emitting layer 433, and an electron transporting layer 435.

The thin film transistor layer 450 includes a plurality of pixel driving circuits 451. Each pixel driving circuit 451 corresponds to a pixel. Based on a display pixel signal and a display driving signal, a corresponding pixel driving circuit 451 is driven so as to proceed with display operation.

According to different designs of the pixel driving circuit 451, such as 2T1C being a pixel driving circuit formed with two thin film transistors and a storage capacitor, and 6T2C being a pixel driving circuit formed with six thin film transistors and two storage capacitors, the gate 4511 of at least one thin film transistor in the pixel driving circuit 451 is connected to a gate line (not shown). According to different designs of driving circuit, a source/drain of at least one thin film transistor in a control circuit is connected to a source line (not shown) and a source/drain of at least one thin film transistor in pixel driving circuit 451 is connected to a corresponding anode pixel electrode 471 of the anode layer 470.

The anode layer 470 is disposed at one side of the thin film transistor layer 450 facing the OLED layer 430. The anode layer 470 includes a plurality of anode pixel electrodes 471. Each of the anode pixel electrodes 471 is corresponding to one pixel driving transistor of the pixel driving circuit 451 of the thin film transistor 450. That is, each of the anode pixel electrodes 471 is connected to a source/drain of the pixel driving transistor of the corresponding pixel driving circuit 451, so as to form a pixel electrode of a specific color, for example a red pixel electrode, a green pixel electrode, or a blue pixel electrode.

The cathode layer 460 is disposed at one side of the upper substrate 410 facing the OLED layer 430 and between the upper substrate 410 and the OLED layer 430. The cathode layer 460 is formed with metal material, preferably metal material with thickness being less than 50 nm. The metal material is selectively to be alloy of aluminum, silver, magnesium, calcium, potassium, lithium, indium, or combination of lithium fluoride, magnesium fluoride, lithium oxide and aluminum. Due to the thickness of the cathode layer 460 being less than 50 nm, the light generated by the OLED layer 430 can pass through it, so as to show images on the upper substrate 410. The cathode layer 460 is intact piece electrical connection, so that it can be used as a shielding. Moreover, the cathode layer 460 also receives the current coming from the anode pixel electrode 471.

The line width of metal sensing lines L1 and the metal sensing lines L2 is equal to or smaller than the line width of the gate line 710 or the line width of the source line 810. The M first conductor line units 40-1, 40-2, . . . , 40-M, the N connection lines 41-1, 41-2, . . . , 41-N, and the N second conductor line units 50-1, 50-2, . . . , 50-N are disposed at positions corresponding to the positions of the plurality of gate lines and the plurality of source lines.

In the prior art, the electrode pads made of ITO have an average light penetration rate of about 90%. In the present invention, the M first conductor line units 40-1, 40-2, . . . , 40-M, the N connection lines 41-1, 41-2, . . . , 41-N, and the N second conductor line units 50-1, 50-2, . . . , 50-N are disposed corresponding to the positions of the plurality of gate lines and the plurality of source lines, so that the light penetration rate is not influenced. Therefore, the light penetration rate of the present invention is much better than that of the prior art. Accordingly, in comparison with the prior touch display panel, the high-accuracy OLED touch display panel structure of narrow border 400 in accordance with the present invention shall have a higher brightness.

Figure 1:
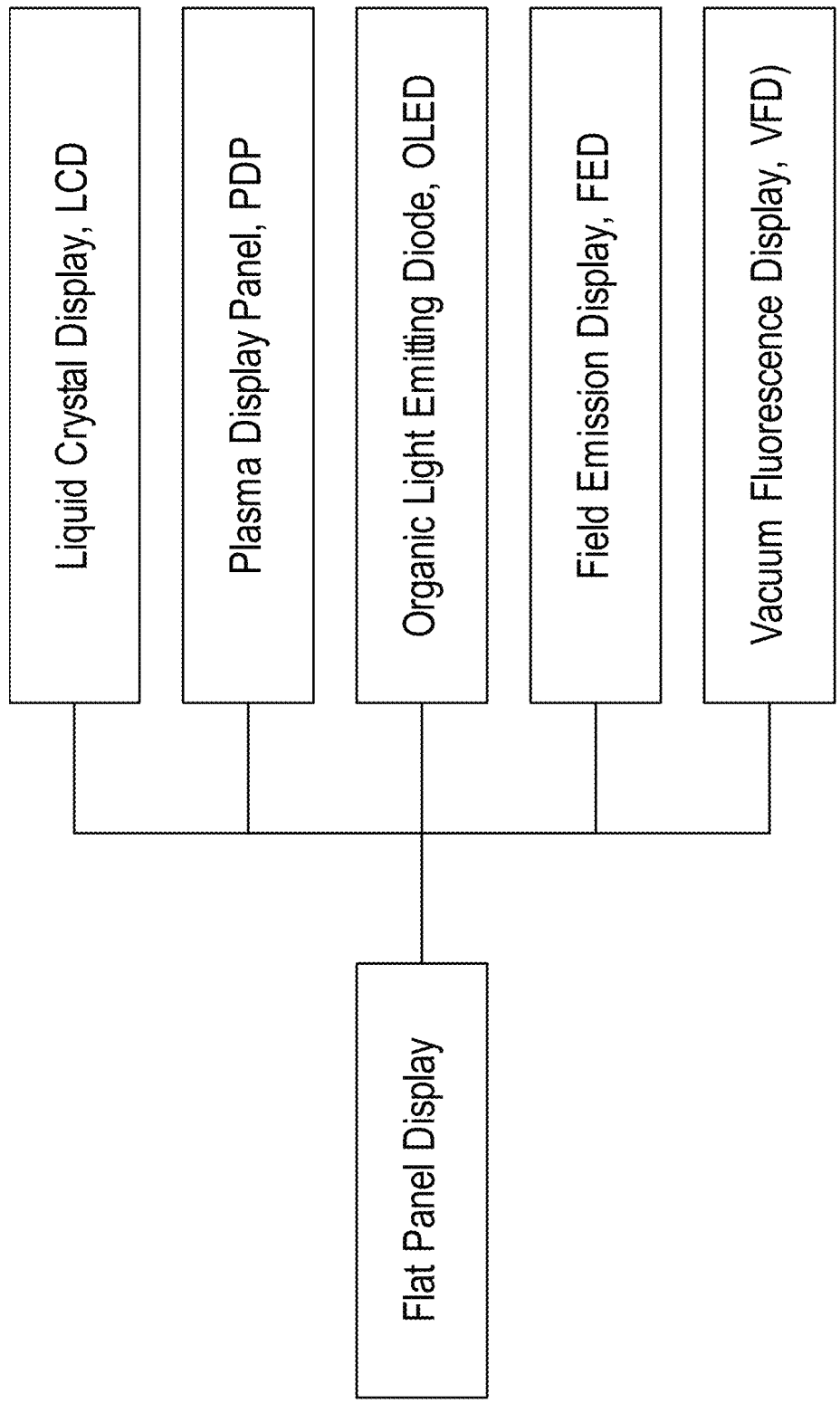
FIG. 1 schematically illustrates the types of prior display panel.
Figure 2:
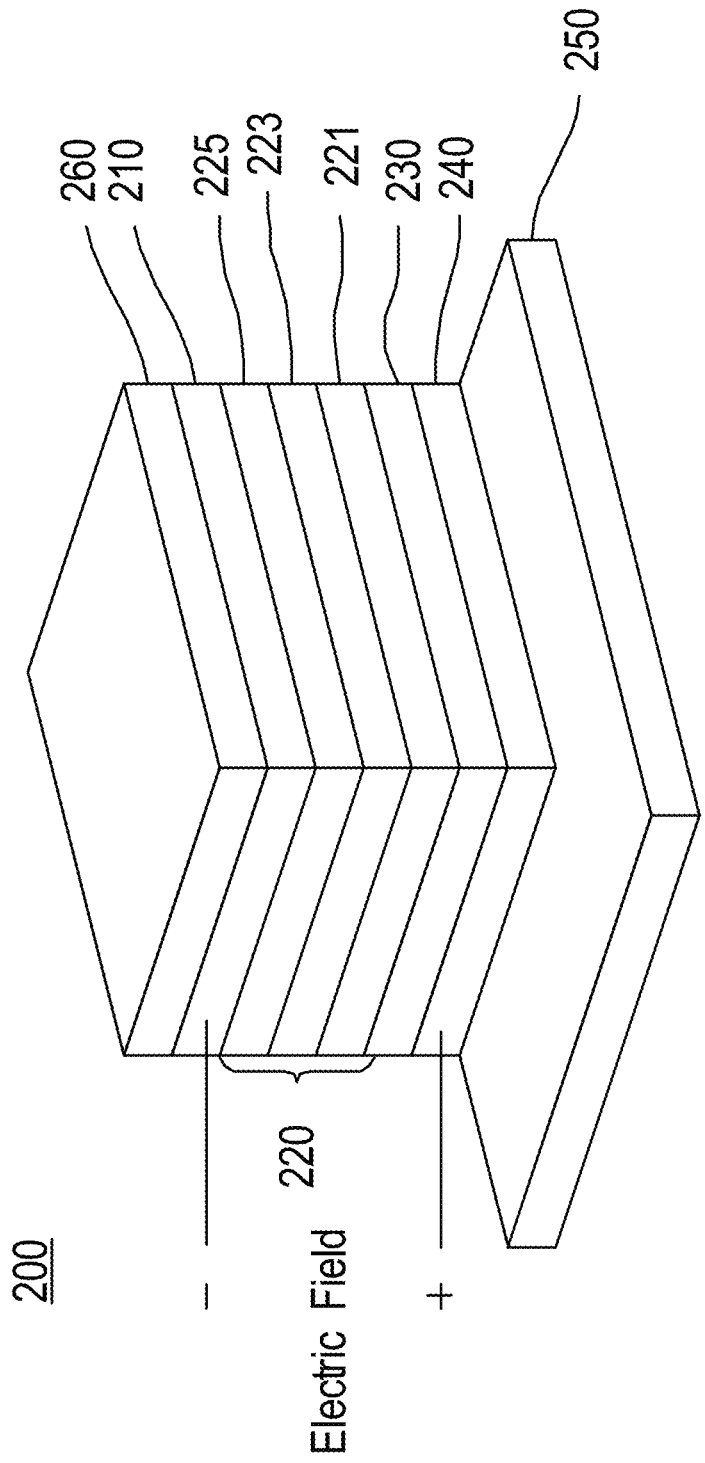
FIG. 2 schematically illustrates the basic structure of a prior OLED.
Figure 3:
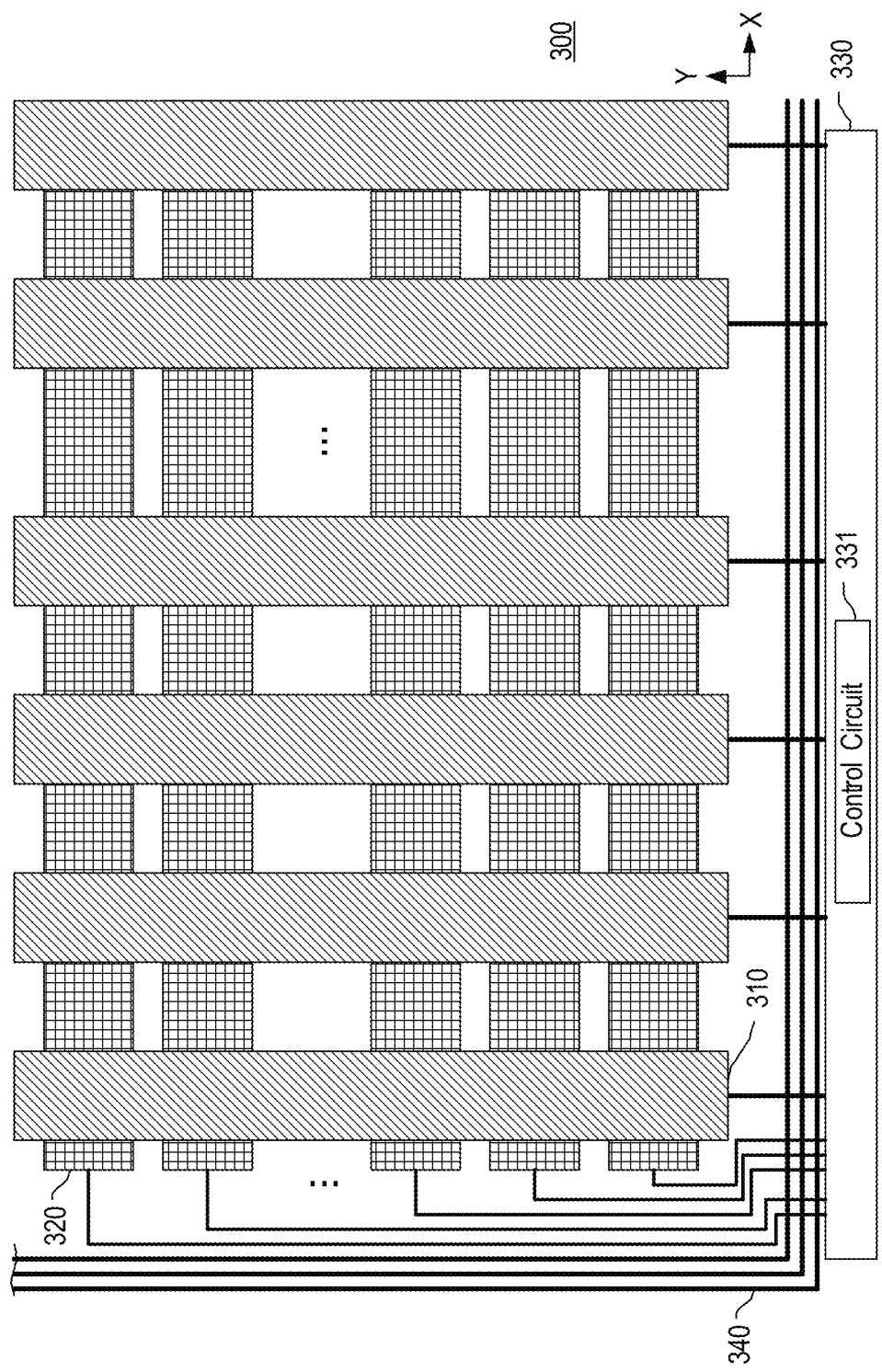
FIG. 3 is a schematic diagram of a prior touch panel structure.

In view of the foregoing, it is known that the prior design as in FIG. 3 shall increase the border width of the touch panel and thus is not suitable for the trend of narrow border. When the touch panel structure of narrow border in accordance with the present invention is embedded into an OLED display panel, the border of the OLED touch display panel becomes narrower, Furthermore, when ITO material is used as a bridge for connecting two ITO electrode points, it is likely to have broken points or defective electrical signals at the bridges due to that the expandability of ITO material is not as good as that of metal. On the other hand, if metal is used as a bridge for connecting two ITO electrode points, it is likely to have defective electrical signals at the bridges due to that metal and ITO are heterogeneous materials, resulting in negatively affecting the accuracy of touch detection.

However, in the present invention, the M first conductor line units 40-1, 40-2, . . . , 40-M, the N second conductor line units 50-1, 50-2, . . . , 50-N and the N connection lines 41-1, 41-2, . . . , 41-N are all made of metal, which has a better conductivity in comparison with the prior art, so as to easily transmit the sensed signals of the connection lines to the control circuit 610, thereby allowing the control circuit 610 to accurately compute the touch coordinates. Accordingly, it is known that the present invention has a better light penetration rate in comparison with the prior art and can lower the manufacturing cost by avoiding the use of expensive ITO material, which is suitable for the touch display panel of narrow border.

Although the present invention has been explained in relation to its preferred embodiment, it is to be understood that many other possible modifications and variations can be made without departing from the spirit and scope of the invention as hereinafter claimed.

What is claimed is:

1. A high-accuracy OLED touch display panel structure of narrow border, comprising:
   an upper substrate;
   a lower substrate parallel to the upper substrate;
   an OLED layer configured between the upper substrate and the lower substrate;
   a sensing electrode layer disposed at one side of the lower substrate facing the OLED layer, the sensing electrode layer having M first conductor line units and N connection lines arranged in a first direction for sensing an approaching external object, where M and N are each a positive integer;
   a thin film transistor layer disposed at one side of the sensing electrode layer facing the OLED layer, the thin film transistor layer including a plurality of gate lines, a plurality of source lines, and N second conductor line units arranged in a second direction for driving a corresponding pixel driving circuit according to a display pixel signal and a display driving signal;
   a cathode layer disposed at one side of the upper substrate facing the OLED layer; and
   an anode layer disposed at one side of the thin film transistor layer facing the OLED layer, the anode layer including a plurality of anode pixel electrodes, each anode pixel electrode being connected to a source or drain of a corresponding pixel driving transistor,
   wherein each second conductor line unit makes use of a corresponding i-th connection line to be extended to one edge of the panel structure of narrow border, where i is a positive integer and $1 \leq i \leq N$, the N second conductor line units, the M first conductor line units, and the N connection lines are disposed corresponding to positions of the plurality of gate lines and source lines.

2. The high-accuracy OLED touch display panel structure of narrow border as claimed in claim 1, wherein each conductor line units is extended to the same edge of the panel structure of narrow border through a corresponding metal wire for being further connected to a flexible circuit board.

3. The high-accuracy OLED touch display panel structure of narrow border as claimed in claim 2, wherein the N connection lines are made of conductive metal material.

4. The high-accuracy OLED touch display panel structure of narrow border as claimed in claim 3, wherein each of the M first conductor line units is composed of plural metal sensing lines, and each of the N second conductor line units is composed of plural metal sensing lines.

5. The high-accuracy OLED touch display panel structure of narrow border as claimed in claim 4, wherein the plural metal sensing lines of each of the M first conductor line units form a quadrilateral region, and the plural metal sensing lines of each of the N second conductor line units form a quadrilateral region, such that the metal sensing lines in each quadrilateral region are electrically connected together.

6. The high-accuracy OLED touch display panel structure of narrow border as claimed in claim 5, wherein the first direction is vertical with the second direction.

7. The high-accuracy OLED touch display panel structure of narrow border as claimed in claim 6, wherein each of the N connection lines is disposed between two first conductor line units.

8. The high-accuracy OLED touch display panel structure of narrow border as claimed in claim 7, wherein the quadrilateral region has a shape of rectangle.

9. The high-accuracy OLED touch display panel structure of narrow border as claimed in claim 8, wherein the metal sensing lines in each quadrilateral region formed by the plural metal sensing lines of each of the M first conductor line units and the N second conductor line units are made of conductive metal material or alloy material.

10. The high-accuracy OLED touch display panel structure of narrow border as claimed in claim 9, wherein the conductive metal material is selectively to be chromium, barium, aluminum, silver, copper, titanium, nickel, tantalum, cobalt, tungsten, magnesium, calcium, potassium, lithium, indium, or a mixture of LiF, MgF2 or Li2O.

11. The high-accuracy OLED touch display panel structure of narrow border as claimed in claim 1, wherein the thin film transistor layer includes:
   a gate line sub-layer having a plurality of gate lines and a plurality of wiring segments, the plurality of gate lines being arranged in the first direction and the plurality of wiring segments being arranged in the second direction, the plurality of wiring segments arranged in the second direction being separated by the plurality of gate lines; and
   a source line sub-layer disposed at one side of the gate line sub-layer facing the OLED layer and having a plurality of source lines and a plurality of wiring segments, the plurality of source lines are arranged in the second direction and the plurality of wiring segments are arranged in the first direction, the plurality of wiring segments arranged in the first direction being separated by the plurality of source lines.

12. The high-accuracy OLED touch display panel structure of narrow border as claimed in claim 11, wherein the plurality of wiring segments arranged in the second direction and the plurality of wiring segments arranged in the first direction are disposed corresponding to positions of the plurality of gate lines and the plurality of source lines.

13. The high-accuracy OLED touch display panel structure of narrow border as claimed in claim 12, wherein each of the plurality of wiring segments arranged in the second direction has two ends respectively having a first extension part and a second extension part arranged in the first direction, and each of the plurality of wiring segments arranged in the first direction has two ends respectively having a first extension part and a second extension part arranged in the second direction, where the extension parts arranged in the first direction are partially overlapped with the extension parts arranged in the second direction.

14. The high-accuracy OLED touch display panel structure of narrow border as claimed in claim 13, wherein the extension parts are partially overlapped and thus electrically connected thereby, so as to allow the plurality of wiring segments arranged in the second direction and the plurality of wiring segments arranged in the first direction to form the N second conductor line units of the thin film transistor layer.

15. The high-accuracy OLED touch display panel structure of narrow border as claimed in claim 1, wherein the OLED layer includes a hole transporting layer, an emitting layer, and an electron transporting layer.

* * * * *